(12) United States Patent
Derhacobian

(10) Patent No.: US 8,659,926 B1
(45) Date of Patent: *Feb. 25, 2014

(54) PMC-BASED NON-VOLATILE CAM

(71) Applicant: Adesto Technologies Corporation, Sunnyvale, CA (US)

(72) Inventor: Narbeh Derhacobian, Belmont, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/647,534

(22) Filed: Oct. 9, 2012

Related U.S. Application Data

(63) Continuation of application No. 12/802,506, filed on Jun. 7, 2010, now Pat. No. 8,320,148.

(60) Provisional application No. 61/269,645, filed on Jun. 25, 2009.

(51) Int. Cl.
*G11C 15/00* (2006.01)

(52) U.S. Cl.
USPC .................. 365/49.18; 365/49.1; 365/49.17; 365/49.16

(58) Field of Classification Search
USPC .............................................. 365/49.1, 49.17
See application file for complete search history.

(56) References Cited

U.S. PATENT DOCUMENTS

| | | | |
|---|---|---|---|
| 7,881,090 B2 * | 2/2011 | Park ........................ | 365/49.17 |
| 8,023,299 B1 * | 9/2011 | Gharia ...................... | 365/49.1 |
| 2006/0250839 A1 * | 11/2006 | Gilbert ....................... | 365/163 |
| 2007/0097740 A1 * | 5/2007 | Derhacobian et al. ...... | 365/163 |
| 2010/0057984 A1 * | 3/2010 | Chen et al. ................. | 711/113 |
| 2011/0299317 A1 * | 12/2011 | Shaeffer et al. ............ | 365/106 |

* cited by examiner

*Primary Examiner* — Fernando Hidalgo
(74) *Attorney, Agent, or Firm* — Michael C. Stephens, Jr.

(57) ABSTRACT

Methods and circuits for CAM cells using PMCs are disclosed herein. In one embodiment, a BCAM cell can include: (i) a first PMC coupled to a first access transistor and a bit node, where the first access transistor is coupled to a true bit line; (ii) a second PMC cell coupled to a second access transistor and the bit node, where the second access transistor is coupled to a complement bit line, and the first and second access transistors are controllable by a word line; (iii) a program enable transistor coupled to the bit node, and configured to couple a program control voltage to the bit node when enabled; and (iv) a match indication transistor configured to discharge a match line in response to states of the true and complement bit lines relative to the bit node.

20 Claims, 7 Drawing Sheets

PMC-BASED NON-VOLATILE CAM

RELATED APPLICATIONS

This application is a continuation of the following application, U.S. patent application Ser. No. 12/802,506, entitled "PMC-BASED NON-VOLATILE CAM," filed on Jun. 7, 2010, now issued as U.S. Pat. No. 8,320,148, and which is hereby incorporated by reference as if it is set forth in full in this specification, and which also claims the benefit of U.S. Provisional Application No. 61/269,645, filed Jun. 25, 2009, which is incorporated herein by reference in its entirety.

FIELD OF THE INVENTION

The present invention generally relates to the field of semiconductor devices. More specifically, embodiments of the present invention pertain to memory cells.

BACKGROUND

Content addressable memories (CAMs) are used in search applications, as well as other applications where computation by processors are to be minimized. A main difference between CAMs and regular memories is that an input to a CAM is a data string (comparand) on which a parallel search is done on a memory array of CAM cells to find matches with stored data therein. If a match is found, the address or location of the matched data is provided as an output from the CAM. Today's CAMs may be relatively expensive with large memories. There are two basic types of CAMs: binary CAM (BCAM) and ternary CAM (TCAM). In a BCAM, logic "1" and logic "0" matches are sought for the data that is being compared, whereas in a TCAM, a "don't care" term can also be used to mask the stored data bits.

SUMMARY

Embodiments of the present invention relate to non-volatile CAM cells utilizing PMCs.

In one embodiment, a BCAM cell can include: a first PMC coupled to a first access transistor and a bit node, where the first access transistor is coupled to a true bit line; a second PMC cell coupled to a second access transistor and the bit node, where the second access transistor is coupled to a complement bit line, the first and second access transistors being controlled by a word line; a program enable transistor coupled to the bit node, and configured to couple a program control voltage to the bit node when enabled; and a match indication transistor configured to discharge a match line in response to states of the true and complement bit lines relative to the bit node.

This BCAM cell can also be configured to form a TCAM cell by adding a mask cell to provide a mask bit node coupled to a discharge path of the match indication transistor.

In another embodiment, a CAM cell can include: a first access transistor coupled to a first PMC and a virtual connection, where the first access transistor is controllable by a true bit line, the first PMC being coupled to a match line; and a second access transistor coupled to a second PMC and the virtual connection, where the second access transistor is controllable by a complement bit line, the second PMC being coupled to the match line.

In another embodiment, a method of controlling a CAM cell can include: programming a data state in the CAM cell, where the CAM cell is configured as noted above; pre-charging the match line associated with the CAM cell; providing a comparand to drive the true and complement bit lines to the CAM cell for a comparison; and determining a highest priority match or a mismatch in response to the comparison.

Embodiments of the present invention can advantageously provide for simplified cells with reduced transistor counts relative to conventional approaches. Particular embodiments are suitable for BCAM or TCAM applications, where all CAM cells use PMC storage elements. These and other advantages of the present invention will become readily apparent from the detailed description of preferred embodiments below.

DETAILED DESCRIPTION

Figure 1:
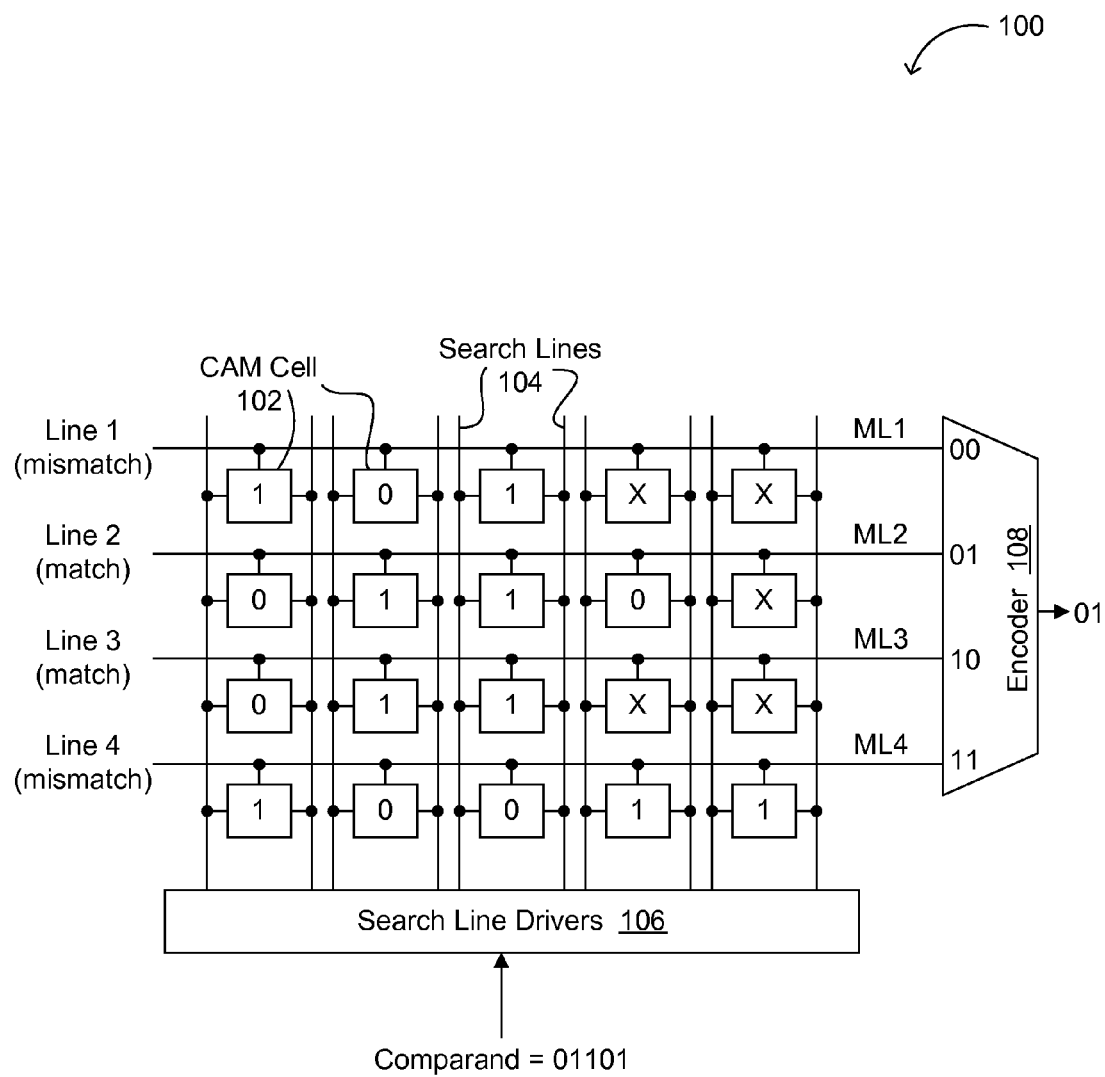
FIG. 1 is a block schematic diagram of an example 4×5 bit CAM.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide for simplified cells with reduced transistor counts relative to conventional approaches. Particular embodiments are directed to programmable metallization cells (PMC). Examples of such cells are shown and described in U.S. Pat. Nos. 6,635,914 and 7,359,236. Particular embodiments are suitable for binary CAM (BCAM) or CAM (TCAM) applications, where all content addressable memory (CAM) cells use PMC storage elements to provide a non-volatile CAM cell. The invention, in its various aspects, will be explained in greater detail below with regard to exemplary embodiments.

Referring now to FIG. 1, shown is a block diagram 100 of a 4×5 bit content addressable memory (CAM), such as may be used in a networking application. This example CAM includes an array of CAM cells 102 arranged as four horizontal words, with each word being 5-bits long. The CAM cells contain both storage and comparison circuitry. Search lines 104 run vertically between columns of CAM cells, and are used to receive the data to be compared (e.g., via the comparand by way of search line drivers 106), and to provide via corresponding bit lines, to CAM cells 102. Match lines (e.g., ML1, ML2, ML3, and ML4) run horizontally between the horizontal words, and indicate whether the bits of the comparand match the bits stored in the CAM cells of any one of the horizontal words. The match lines may be coupled to inputs of encoder 108 to generate an address corresponding to a matched word. For example, encoder 108 may be a priority encoder that selects a highest priority matched word from a plurality of matched words.

Figure 2:
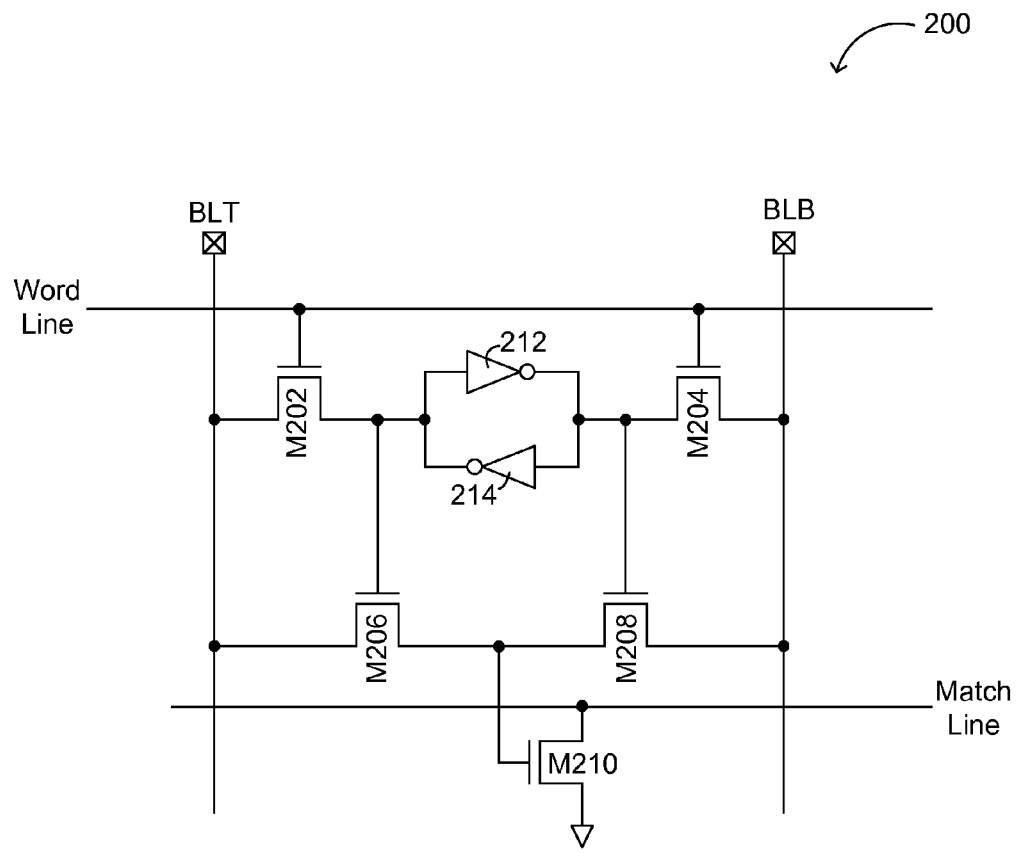
FIG. 2 is a block schematic diagram of an example CMOS 9-transistor BCAM cell.

FIG. 2 is a schematic block diagram 200 of an example CMOS 9-transistor BCAM cell. The word line controls access transistors M202 and M204, which connect to the storage element formed by cross-coupled inverters 212 and 214. A CAM search operation begins with pre-charging all match lines, thereby placing them all temporarily in a match state. Next, search line drivers 106 (see FIG. 1) drive the search data (e.g., comparand "01101") onto the search lines/bit lines (e.g., complementary bit lines BLT and BLB). Each CAM cell (e.g., the cell of FIG. 2, CAM cells 102 of FIG. 1) compares its stored bit against the bit on its corresponding search lines 104, which are coupled to the bit lines (e.g., BLT and BLB). Cells with matching data do not affect the cell's corresponding match line, but cells with mismatching data pull down their corresponding match lines. This discharging action on the match line is performed by pull-down transistor M210 and either of transistors M206 and M208, depending on which of BLT and BLB is high. Cells storing an X (don't care term) operate as if a match has occurred.

The aggregate result is that match lines are pulled down for any word that has at least one bit mismatch, while all other match lines remain substantially in the pre-charged matched state. In the example of FIG. 1, match lines 2 and 3 remain pre-charged (indicating a match), while match lines 1 and 4 discharge to ground, indicating a mismatch. Finally, encoder 108 generates a search address location corresponding to the matching data. In this particular example, encoder 108 numerically selects the smallest numbered match line of the two matching lines in a priority determination to generate the match address "01".

Exemplary Non-Volatile BCAM Cell

In particular embodiments, a BCAM cell can include: a first PMC coupled to a first access transistor and a bit node, where the first access transistor is coupled to a true bit line; a second PMC cell coupled to a second access transistor and the bit node, where the second access transistor is coupled to a complement bit line, the first and second access transistors being controlled by a word line; a program enable transistor coupled to the bit node, and configured to couple a program control voltage to the bit node when enabled; and a match indication transistor configured to discharge a match line in response to states of the true and complement bit lines relative to the bit node.

Figure 3A:
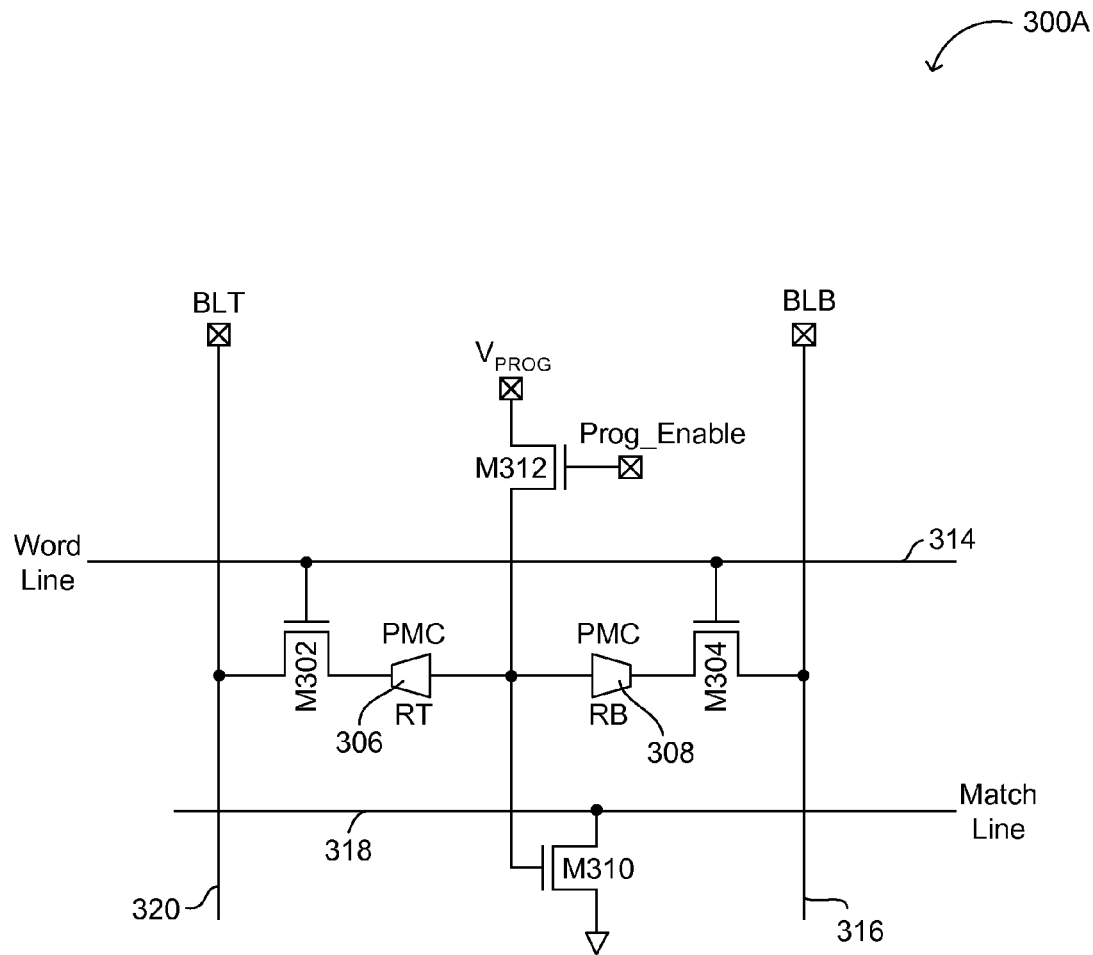
FIG. 3A is an example BCAM cell structure in accordance with embodiments of the present invention.

Referring now to FIG. 3A, shown is an example BCAM cell structure 300A in accordance with embodiments of the present invention. Access transistors M302 and M304 to respective PMC elements 306 and 308 may be controlled by the word line (WL) 314. Also, a program enable signal is used to enable a programming control voltage (e.g., $V_{PROG}$) to the cell. Programming/erasing can be done in one, two, or more steps. In a particular two step programming example, RT 306 can be programmed first, and then RB 308. For example, to program RT 306 (e.g., going from high resistance to low resistance), values as shown below in Table 1 can be used.

TABLE 1

| Terminal | Voltage |
| --- | --- |
| Prog_Enable | $V_{TP} + V_t$ |
| $V_{PROG}$ | $V_{TP}$ |
| WL | $V_{DD} + V_{TP}$ |
| BLT | 0 |
| BLB | $V_{TP}$ |

In this way, RT 306 can have voltage across it for programming, and RB 308 may have substantially no voltage across during this time, thus no programming may occur on RB 308. RB 308 can also be programmed in a similar fashion. Here, $V_{DD}$ is a supply voltage, $V_{TP}$ is a minimum threshold voltage needed to program the cell, and $V_t$ is the threshold voltage of the NMOS transistor (e.g., M312) enabled by a program enable control signal (prog_enable). To erase RT 306 (e.g., going from low resistance to high resistance), example values as shown below in Table 2 can be used.

TABLE 2

| Terminal | Voltage |
| --- | --- |
| Prog_Enable | $V_{TP} + V_t$ |
| $V_{PROG}$ | 0 |
| WL | $V_{DD} + V_{TP}$ |
| BLT | $V_{TP}$ |
| BLB | 0 |

For example, $V_{TP}$ can be any voltage in a range of from about 0.1 V to about 5 V (e.g., about 1.2V), $V_t$ can be any voltage in a range of from about 0.0 V to about 1 V (e.g., about 0.5 V). Also, supply voltage $V_{DD}$ can be any voltage in a range of from about 0.5 V to about 3.3 V (e.g., about 1 V, based on the particular technology used). Further, a high resistance value for an erased PMC can be any resistance in a range of from about 100 KΩ to about 10 GΩ (e.g., about 1 MΩ), and a low resistance value for a programmed PMC can be any resistance in a range of from about 90 KΩ to about 100Ω (e.g., about 10 KΩ). Of course, other voltages and/or resistance values outside of these particular exemplary ranges, may also be appropriate in particular embodiments.

In another example, a single step write can be performed, where both RT 306 and RB 308 are written (programmed/erased) at substantially the same time. In one example, to program a "data 0" value, PMC RT 306 is programmed to change from a high resistance to a low resistance, while PMC RB 308 is erased to change from a low resistance to a high resistance. To accomplish this, word line 314 can be brought high, and programming voltages can be provided as shown below in Table 3. In this fashion, RT 306 may have a voltage of about $-V_{TP}$ across it, and RB 308 may have a voltage of about $+V_{TP}$ across it, when program and erase voltages are substantially symmetrical for each PMC element. Example voltage ranges for $V_{P1}$ can be from about 0.1V to about 7V (e.g., about 2V).

TABLE 3

| Terminal | Voltage |
| --- | --- |
| Prog_Enable | $V_{P1} + V_t$ |
| $V_{PROG}$ | $V_{P1}$ |
| WL | $V_{DD} - V_t$ |
| BLT | $V_{P1} + V_{TP}$ |
| BLB | $V_{P1} - V_{TP}$ |

In this example, to program a "data 1" value, PMC RT 306 is erased to change from a low resistance to a high resistance, while PMC RB 308 is programmed to change from a high resistance to a low resistance. To accomplish this, word line 314 can be brought high, and programming voltages can be provided as shown below in Table 4.

TABLE 4

| Terminal | Voltage |
| --- | --- |
| Prog_Enable | $V_{P1} + V_t$ |
| $V_{PROG}$ | $V_{P1}$ |
| WL | $V_{DD} - V_t$ |
| BLT | $V_{P1} - V_{TP}$ |
| BLB | $V_{P1} + V_{TP}$ |

Figure 3B:
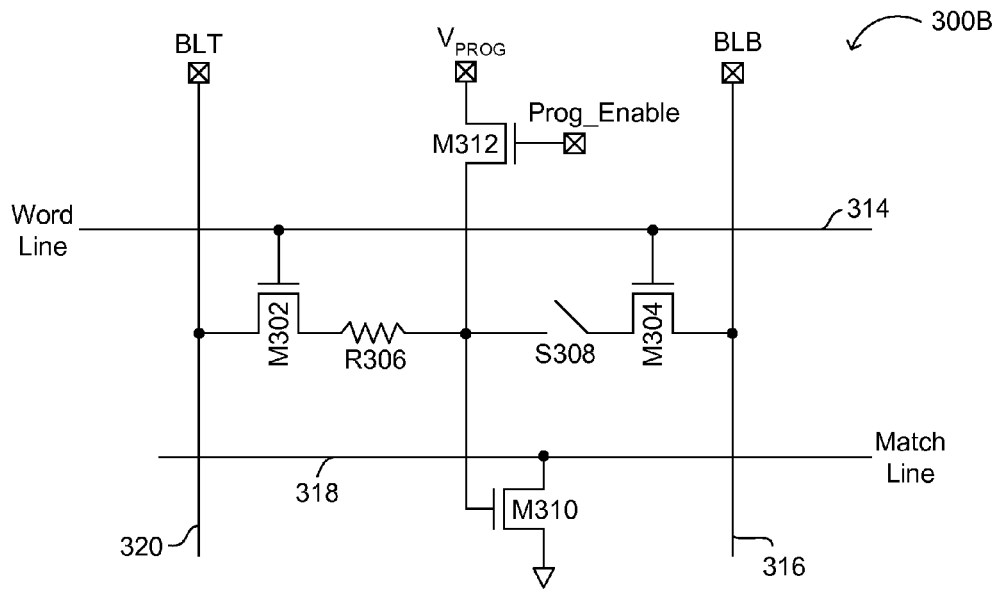
FIG. 3B is an example "data 0" programmed in the BCAM cell of FIG. 3A, in accordance with embodiments of the present invention.

Referring now to FIG. 3B, shown (300B) is an example "data 0" programmed in the BCAM cell of FIG. 3A, in accordance with embodiments of the present invention. As shown, PMC RT can have a low resistance state (e.g., represented by a resister R306), while PMC RB has a high resistance state (e.g., represented by an open switch S308). Thus, a match is found when BLB 316 is high and BLT 320 is low (e.g., corresponding to a "0" value on that bit of the search lines), such that pull-down transistor M310 coupled to match line 318 is turned off. In this fashion, a pre-charge high of match line 318 will be maintained if all bits along that word match. A mismatch is found when BLB 316 is low and BLT 320 is high (e.g., corresponding to a "1" value on that bit of the search lines), such that pull-down transistor M310 coupled to match line 318 is turned on. In this fashion, a pre-charge high of match line 318 will be discharged to convey the mismatch condition.

Figure 3C:
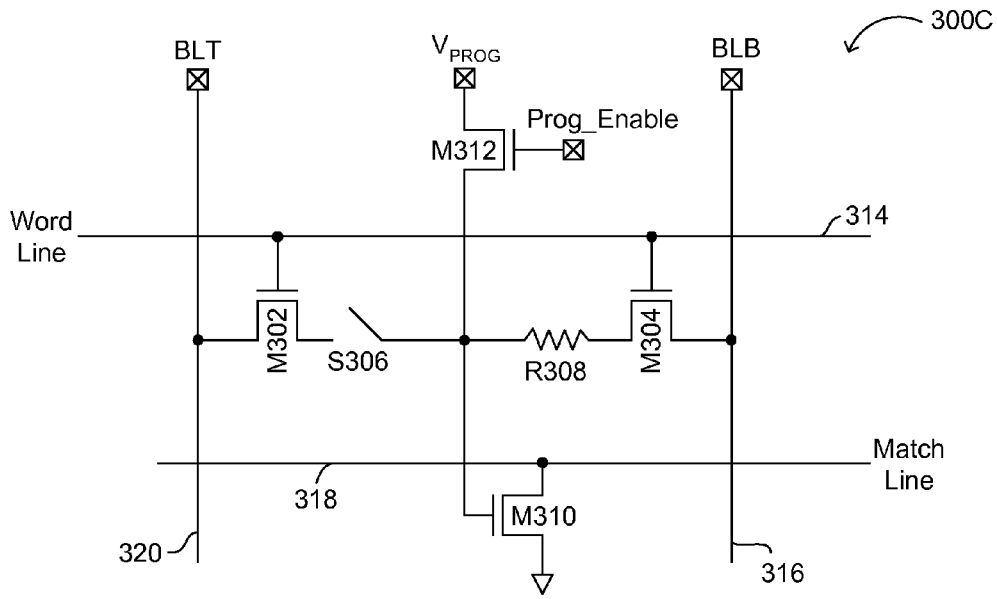
FIG. 3C is an example "data 1" programmed in the BCAM cell of FIG. 3A, in accordance with embodiments of the present invention.

Referring now to FIG. 3C, shown (300C) is an example "data 1" programmed in the BCAM cell of FIG. 3A, in accordance with embodiments of the present invention. As shown, PMC RT can have a high resistance state (e.g., represented by an open switch S306), while PMC RB has a low resistance state (e.g., represented by a resister R308). Thus, a match is found when BLB 316 is low and BLT 320 is high (e.g., corresponding to a "1" value on that bit of the search lines), such that pull-down transistor M310 coupled to match line 318 is turned off. In this fashion, a pre-charge high of match line 318 will be maintained if all bits along that word match. A mismatch is found when BLB 316 is high and BLT 320 is low (e.g., corresponding to a "0" value on that bit of the search lines), such that pull-down transistor M310 coupled to the match line is turned on. In this fashion, a pre-charge high of match line 318 will be discharged to convey the mismatch condition.

Exemplary Non-Volatile TCAM Cell

In particular embodiments, a BCAM cell (e.g., as shown above in FIG. 3A) can be configured to form a ternary content addressable memory (TCAM) cell by adding a mask cell to provide a mask bit node coupled to a discharge path of the match indication transistor.

Figure 4:
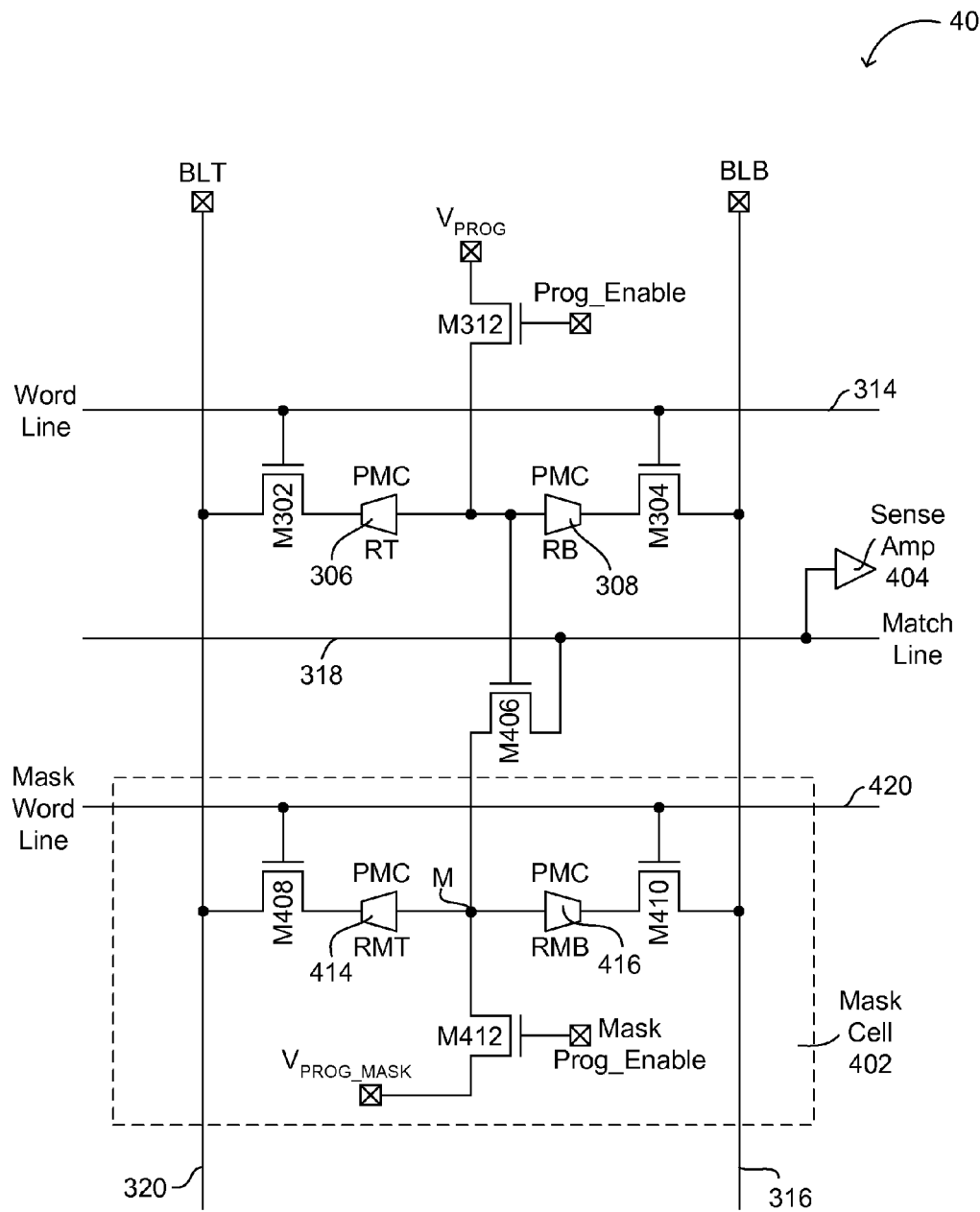
FIG. 4 is an example TCAM cell structure in accordance with embodiments of the present invention.

Referring now to FIG. 4, shown is an example TCAM cell structure 400 in accordance with embodiments of the present invention. In this example, the main storage cell is programmed to store data 1 and data 0 values as discussed above. For example, to program a data 0 value, PMC RB 308 may be erased to change from a low resistance to a high resistance, while PMC RT 306 is programmed to change from a high resistance to a low resistance. Further, to program a data 1 value, PMC RB 308 can be programmed to change from a high resistance to a low resistance, while PMC RT 306 is erased to change from a low resistance to a high resistance.

Because a mask cell 402 is included in the example TCAM cell 400, the mask bit being on (e.g., node M at a high level relative to the match line pre-charge level) makes the bits stored in the corresponding main cell become a don't care term by not providing a discharge path on the match line. Mask cell 402 includes access transistors M408 and M410 respectively coupled to RMT 414 and RMB 416, and program control transistor M412 for receiving mask program control voltage, $V_{PROG\_MASK}$. Also, a discharge path from match line 318 includes main cell pull-down transistor M406 coupled to mask bit node M, which may be discharged via BLB/BLT if the mask bit is off. When the mask bit is off (e.g., node M at a low level), the stored state of data 1 or data 0 in the main cell is thus considered. Further, a level of match line 318 can be amplified (e.g., via sense amplifier 404) for subsequent use by another circuit, such as a priority encoder.

Main cell program control voltage, $V_{PROG}$, and mask program control voltage, $V_{PROG\_MASK}$, may have a same value and/or be separately controlled (e.g., with different values) for independent program/erase of main and mask bits. Similarly, main cell word line 314 and mask word line 420 may be independently controlled in some situations, such as in program/erase modes, while both main cell word line 314 and mask word line 420 may be on (e.g., have a same value) for compare mode operation. As such, operational examples (e.g., program, erase, etc.) as to main cell word line and program control voltage, $V_{PROG}$, are also applicable to corresponding mask word line 420 and program control voltage, $V_{PROG\_MASK}$, of mask cell 402.

For the mask bit to be on such that the main cell bit value is a don't care term, both of PMCs RMT 414 and RMB 416 can be erased to be in a high resistance state. This makes node M essentially float without a path to ground when the word line is on, no matter the state of BLB/BLT. Thus in this state, node M may not allow a discharge of match line 314 via BLB or BLT, regardless of the state of the corresponding main bit. For the mask bit to be off such that the corresponding main cell bit value is a care about, both of PMCs RMT 414 and RMB 416 can be programmed to be in a low resistance state. This causes node M to be about half of $V_{DD}$, or the lower of bit lines BLB/BLT, which can provide a sufficient discharge path on match line 318 based on the state stored in the main cell.

Exemplary Non-Volatile BCAM/TCAM Cell

In particular embodiments, a CAM cell can include: a first access transistor coupled to a first PMC and a virtual connection, where the first access transistor is controllable by a true bit line, the first PMC being coupled to a match line; and a second access transistor coupled to a second PMC and the virtual connection, where the second access transistor is controllable by a complement bit line, the second PMC being coupled to the match line.

Figure 5:
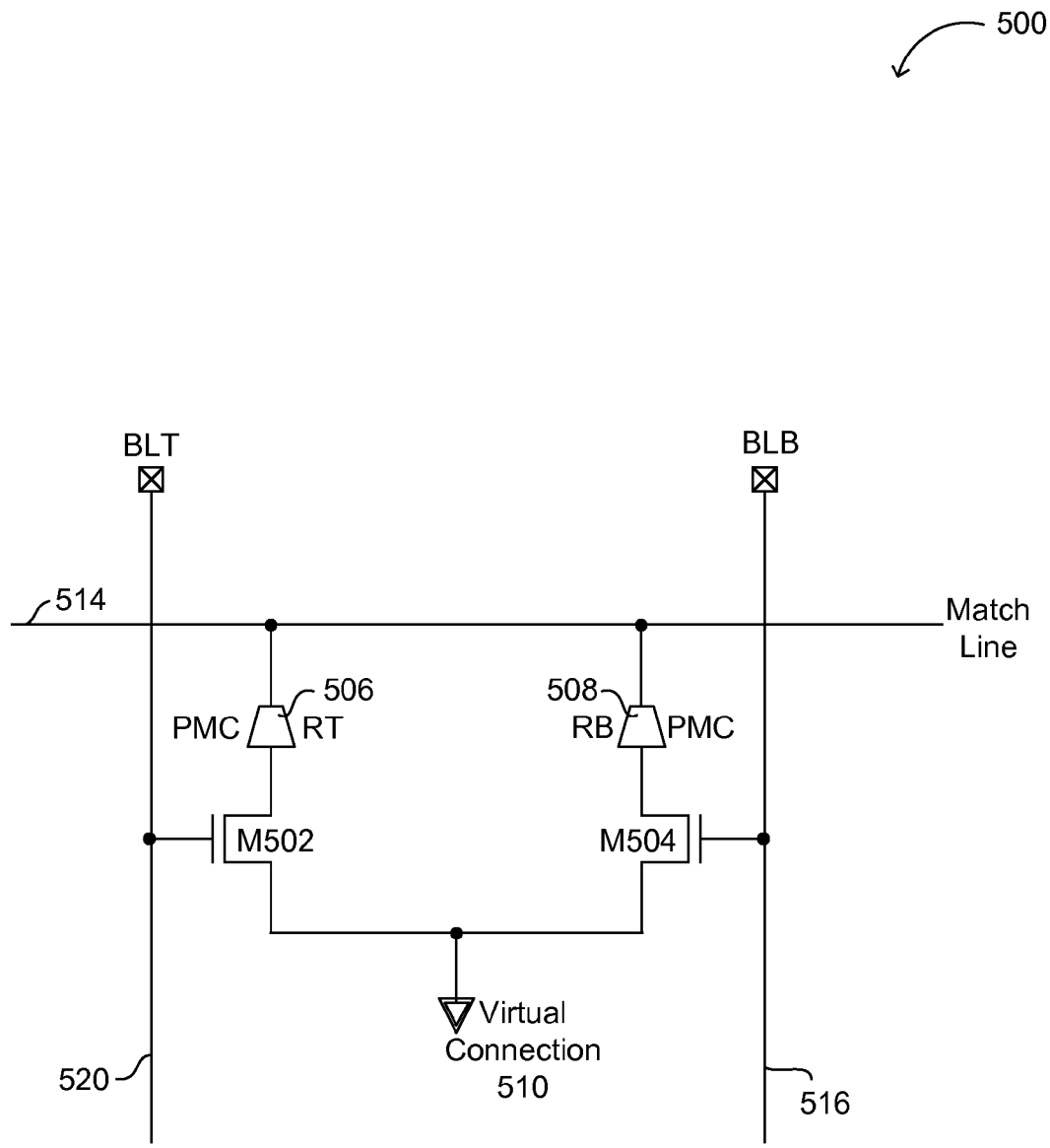
FIG. 5 is an example simplified cell suitable for use as a BCAM or TCAM, in accordance with embodiments of the present invention.

Referring now to FIG. 5, shown is an example simplified cell 500 suitable for use as a BCAM or TCAM, in accordance with embodiments of the present invention. In this arrangement, virtual connection 510 is employed, and may be used for writes as well as match line operation. To form a don't care term suitable for TCAM operation, both of PMC RT 506 and PMC RB 508 can be erased to be in a high resistance state.

The match line 514 can also be used for a write circuit operation. For a data 1 value, PMC RT 506 can be in a high resistance state, and PMC RB 508 can be in a low resistance state, such that a high level on BLT 520 (low level on BLB 516) during a comparison results in no discharge path on the match line 514 via transistor M502, resulting in a match condition. For a data 0 value, PMC RB 508 can be in a high resistance state, and PMC RT 506 can be in a low resistance state, such that a high level on BLB 516 (low level on BLT 520) during a comparison results in no discharge path on the match line via transistor M504 for a match condition.

Writing data values into the RT and RB PMCs in the particular example circuit of FIG. 5, a multiple step process can be employed. For example, an appropriate value can be written into PMC RT 506, and then a value can be written into PMC RB 508. To accomplish an example data 1 write operation, programming voltages can be provided as shown below in Table 5.

TABLE 5

| Operation | BLT | BLB | Match Line | Virtual Connection |
|---|---|---|---|---|
| Write 1 (step 1) | High or ON | 0 V or OFF | 0 V | >$V_{TP}$ |
| Write 1 (step 2) | 0 V or OFF | High or ON | >$V_{TP}$ | 0 V |

In example step 1 above, $V_{TP}$ can be applied across element PMC RT to program RT by having PMC RT 506 go from a relatively high resistance to a relatively low resistance state. For example, BLT 520 at a "high" or "ON" level allows $V_{TP}$ to be passed on from the virtual connection 510 across element PMC RT 506. In example step 2 above, $V_{TP}$ can be applied across element PMC RB 508 to erase RB by having PMC RB go from a relatively low resistance to a relatively high resistance state. For example, BLB 516 at a "high" or "ON" level allows $V_{TP}$ to be passed on from virtual connection 510 across the element PMC RB 508. In this fashion, a data 1 value can be written into the cell, and similar appropriate voltage applications can be used to write a data 0 into this example cell.

Exemplary Method of Controlling a CAM Cell

In particular embodiments, a method of controlling a CAM cell (e.g., example CAM cells of FIGS. 3A-3C, FIG. 4, and/or FIG. 5) can include: programming a data state in the CAM cell; pre-charging the match line associated with the CAM cell; providing a comparand to drive the true and complement bit lines to the CAM cell for a comparison; and determining a highest priority match or a mismatch in response to the comparison.

Figure 6:
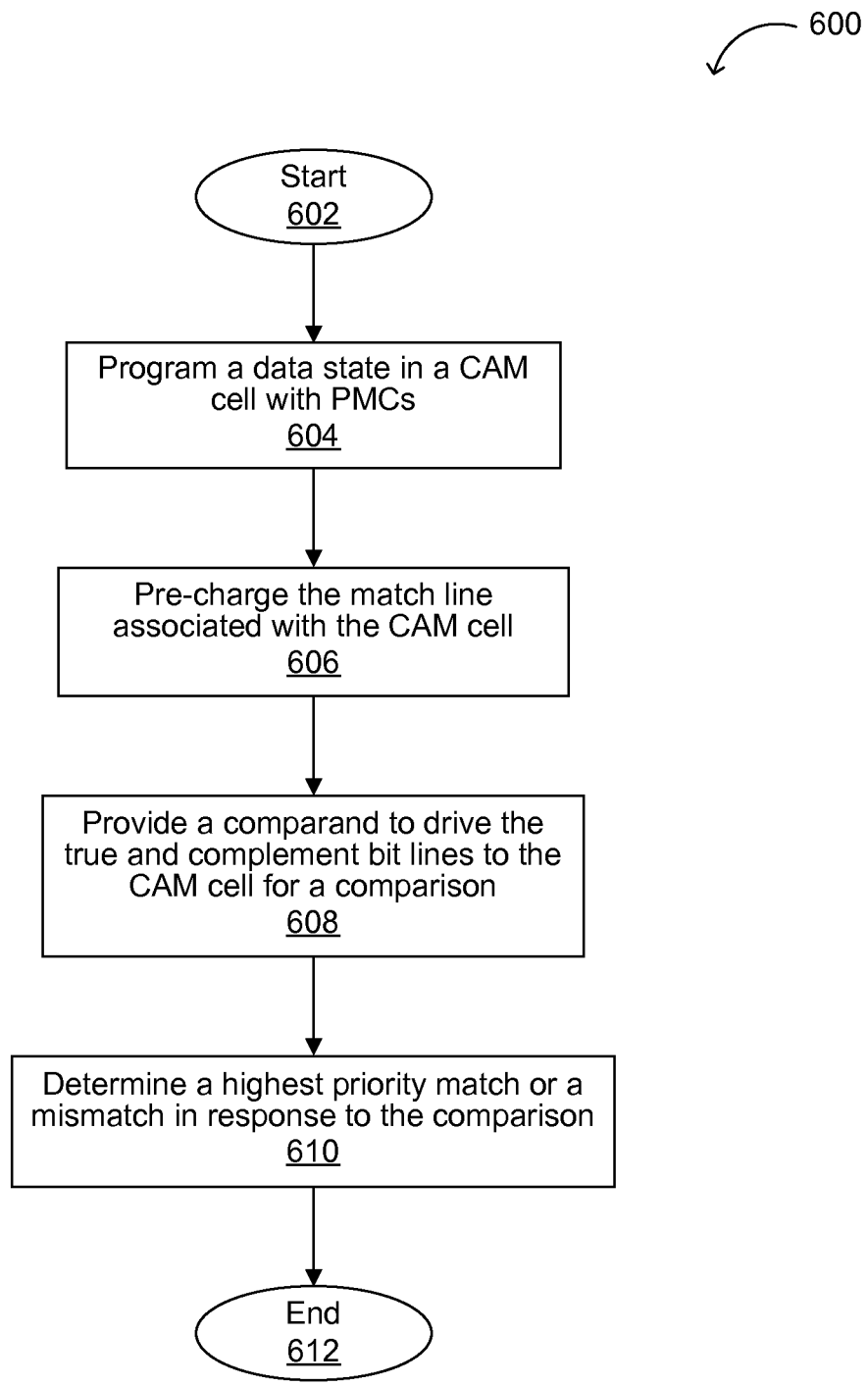
FIG. 6 is a simplified flow chart of an example method of controlling a CAM in accordance with embodiments of the present invention.

Referring now to FIG. 6, shown is an example simplified flow chart of a method 600 of controlling a CAM in accordance with embodiments of the present invention. The flow begins (602), and a data state can be programmed in the CAM cell with PMCs (604). For example, such a CAM cell can be any of the example cells shown above with reference to FIGS. 3A-3C, FIG. 4, and FIG. 5, and the data state can involve one or more programming and/or erasing steps for the PMCs in the CAM cells. The match line associated with the CAM cell can be pre-charged (606), such as to a high level, a mid-$V_{DD}$ level, or to any suitable level. Next, a comparand or search key can be provided to drive the true and complement bit lines to the CAM cell for performing a comparison (608). In response thereto, a highest priority match or a mismatch can be determined (610), thus completing the flow (612).

Particular embodiments differ from conventional approaches in many respects. As just a few examples: (i) a PMC storage element is used instead of an SRAM, DRAM, or any other type of storage element; (ii) a 4-transistor BCAM cell (see, e.g., FIG. 3A) may realized, as opposed to a conventional 9-transistor SRAM-based BCAM cell; (iii) a 9-transistor TCAM cell (see, e.g., FIG. 4) is realized, as opposed to a conventional 19-transistor SRAM-based TCAM cell; and/or (iv) a simplified cell (see, e.g., FIG. 5) suitable for BCAM or TCAM applications is disclosed, where all CAM cells use PMC storage elements.

While the above examples include circuit and structural implementations of certain memory cells, one skilled in the art will recognize that other technologies and/or cell structures can be used in accordance with embodiments. Further, one skilled in the art will recognize that other device circuit arrangements, elements, and the like, may also be used in accordance with embodiments. Also, while control circuitry described above can be implemented using AND-gates, OR-gates, S-R flip-flops, detectors, comparators, and/or amplifiers, particular embodiments are also applicable to other circuit components. Also, methods and circuits discussed herein can also be applied to different types of transistors (e.g., PMOS transistors, BJT devices, etc.), and to memory architectures, and other arrangements (e.g., a match line that is pre-charged low with a pull-up transistor indicating a mismatch).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A binary content addressable memory (BCAM) cell, comprising:
   a) a first programmable metallization cell (PMC) coupled to a first access transistor and a bit node, wherein the first access transistor is coupled to a true bit line;
   b) a second PMC coupled to a second access transistor and the bit node, wherein the second access transistor is coupled to a complement bit line, the first and second access transistors being controlled by a word line;
   c) a program enable transistor coupled to the bit node, and configured to couple a program control voltage to the bit node when enabled, wherein during a single step write, one of the first and second PMCs is configured to be programmed while another of the first and second PMCs is configured to be erased, wherein the true bit line and the complement bit line differ by at least a program threshold voltage during the single step write; and
   d) a match indication transistor configured to discharge a match line in response to states of the true and complement bit lines relative to resistances of the first and second PMCs.

2. The BCAM cell of claim 1, wherein the match indication transistor is configured to discharge the match line when the word line is active and at least one of:
   a) the true bit line is at a high voltage level, and the first PMC is in a low resistance; and
   b) the complement bit line is at a high voltage level, and the second PMC has a low resistance.

3. The BCAM cell of claim 1, wherein one of the first and second PMCs is programmed by:
   a) activating the word line;
   b) enabling the program enable transistor;
   c) setting the program control voltage to a program threshold voltage; and
   d) setting one of the true bit line and the complement bit line to the program threshold voltage, while discharging another of the true bit line and the complement bit line.

4. The BCAM cell of claim 1, wherein one of the first and second PMCs is erased by:
   a) activating the word line;
   b) enabling the program enable transistor;
   c) discharging the program control voltage; and
   d) setting one of the true bit line and the complement bit line to the program threshold voltage, while discharging another of the true bit line and the complement bit line.

5. The BCAM cell of claim 1, wherein:
   a) the first PMC is programmed to change from a high resistance to a low resistance; and
   b) the second PMC is erased to change from a low resistance to a high resistance.

6. The BCAM cell of claim 5, wherein the programming and erasing are performed by:
   a) activating the word line;
   b) enabling the program enable transistor;
   c) setting the program control voltage to a second program voltage;
   d) setting the true bit line to a sum of the program threshold voltage and the second program voltage; and
   e) setting the complement bit line to a difference of the program threshold voltage and the second program voltage.

7. The BCAM cell of claim 1, wherein:
   a) the first PMC is erased to change from a low resistance to a high resistance; and
   b) the second PMC is programmed to change from a high resistance to a low resistance.

8. The BCAM cell of claim 7, wherein the program and erase are configured to be performed by:
   a) activating the word line;
   b) enabling the program enable transistor;
   c) setting the program control voltage to a second program threshold voltage;
   d) setting the complement bit line to a sum of the program threshold voltage and the second program voltage; and
   e) setting the true bit line to a difference of the program threshold voltage and the second program voltage.

9. A BCAM array, comprising:
   a) a plurality of BCAM cells arranged as X rows by Y columns, wherein each BCAM cell comprises the BCAM cell of claim 1; and
   b) a priority encoder coupled to the X rows, wherein the priority encoder is configured to determine at least one priority match from a plurality of match lines corresponding to the X rows.

10. A ternary CAM (TCAM) cell, comprising:
    a) the BCAM cell of claim 1; and
    b) a mask cell providing a mask bit node coupled to the match indication transistor.

11. The TCAM cell of claim 10, wherein the mask cell comprises:
    a) a first mask PMC coupled to a first mask access transistor and mask bit node, wherein the first mask access transistor is coupled to the true bit line;
    b) a second mask PMC coupled to a second mask access transistor and the mask bit node, wherein the second mask access transistor is coupled to the complement bit line, the first and second mask access transistors being controlled by a mask word line; and
    c) a mask program enable transistor coupled to the mask bit node, and configured to couple a mask program control voltage to the mask bit node when enabled, wherein the match indication transistor is coupled to the mask bit node.

12. The TCAM cell of claim 11, wherein the mask cell is in an on state to make the BCAM cell a don't care term by erasing both the first mask PMC and the second mask PMC to a high resistance level.

13. The TCAM cell of claim 11, wherein the mask cell is in an on state to make the BCAM cell a don't care term by programming both the first mask PMC and the second mask PMC to a low resistance level.

14. A TCAM array, comprising:
    a) a plurality of TCAM cells arranged as X rows by Y columns, wherein each TCAM cell comprises the TCAM cell of claim 10; and
    b) a priority encoder coupled to the X rows, wherein the priority encoder is configured to determine at least one priority match from a plurality of match lines corresponding to the X rows.

15. A CAM cell, comprising:
    a) a first access transistor coupled to a first PMC and a virtual connection, wherein the first access transistor is controllable by a true bit line, the first PMC being coupled to a match line; and
    b) a second access transistor coupled to a second PMC and the virtual connection, wherein the second access transistor is controllable by a complement bit line, the second PMC being coupled to the match line, and wherein during a multiple step write, one of the first and second PMCs is configured to be written to with the virtual connection being at a potential greater than a program threshold voltage prior to writing to another of the first and second PMCs with the virtual connection being at a ground level potential.

16. The CAM cell of claim 15, wherein both of the first PMC and the second PMC are erased to a high resistance to provide a don't care value for TCAM operation of the CAM cell.

17. The CAM cell of claim 15, wherein one of the first PMC and the second PMC is erased to a high resistance, and another of the first PMC and the second PMC is programmed to a low resistance, to provide a data value for BCAM operation of the CAM cell.

18. A method of controlling a CAM cell, the method comprising:
 a) programming a data state in the CAM cell, wherein the CAM cell is configured according to claim 1;
 b) pre-charging the match line associated with the CAM cell;
 c) providing a comparand to drive the true and complement bit lines to the CAM cell for a comparison; and
 d) determining a highest priority match or a mismatch in response to the comparison.

19. A method of controlling a CAM cell, the method comprising:
 a) programming a data state in the CAM cell, wherein the CAM cell is configured according to claim 10;
 b) pre-charging the match line associated with the CAM cell;
 c) providing a comparand to drive the true and complement bit lines to the CAM cell for a comparison; and
 d) determining a highest priority match or a mismatch in response to the comparison.

20. A method of controlling a CAM cell, the method comprising:
 a) programming a data state in the CAM cell, wherein the CAM cell is configured according to claim 15;
 b) pre-charging the match line associated with the CAM cell;
 c) providing a comparand to drive the true and complement bit lines to the CAM cell for a comparison; and
 d) determining a highest priority match or a mismatch in response to the comparison.

* * * * *